United States Patent [19]

Kondo et al.

[11] Patent Number: 4,801,067
[45] Date of Patent: Jan. 31, 1989

[54] METHOD OF CONNECTING METAL CONDUCTOR TO CERAMIC SUBSTRATE

[75] Inventors: Kazuo Kondo; Tsuneyuki Sukegawa; Asao Morikawa, all of Aichi, Japan

[73] Assignee: NGK Spark Plug Co., Ltd., Aichi, Japan

[21] Appl. No.: 89,762

[22] Filed: Aug. 27, 1987

[30] Foreign Application Priority Data

Aug. 29, 1986 [JP] Japan .................................... 201231
Sep. 24, 1986 [JP] Japan .................................... 223763

[51] Int. Cl.$^4$ .......................... B23K 1/04; H01R 9/06; H05K 3/00
[52] U.S. Cl. .................................... 228/123; 228/124; 228/263.12; 29/843
[58] Field of Search ................... 228/123, 124, 263.12, 228/122; 29/843

[56] References Cited

U.S. PATENT DOCUMENTS

| | | | |
|---|---|---|---|
| 3,649,803 | 3/1972 | Desmond et al. | 228/124 |
| 3,862,488 | 1/1975 | Pessell et al. | |
| 4,610,934 | 9/1986 | Boecker et al. | 228/263.12 |

FOREIGN PATENT DOCUMENTS

| | | | |
|---|---|---|---|
| 556614 | 4/1958 | Canada | 228/124 |
| 2816249 | 10/1978 | Fed. Rep. of Germany | 228/124 |
| 59-92943 | of 1984 | Japan | |
| 60-30456 | of 1985 | Japan | |
| 90879 | 5/1985 | Japan | 228/263.12 |
| 81072 | 5/1985 | Japan | 228/263.12 |
| 166165 | 8/1985 | Japan | 228/263.12 |
| 200869 | 10/1985 | Japan | 228/263.12 |

OTHER PUBLICATIONS

"A Low Stressed Bonding Structure for Thin Film Adhesion", Research Disclosure, Oct. 1986, No. 270, 27033.

Primary Examiner—Nicholas P. Godici
Assistant Examiner—Samuel M. Heinrich
Attorney, Agent, or Firm—Finnegan, Henderson, Farabow, Garrett, & Dunner

[57] ABSTRACT

A method of connecting a metal conductor to a ceramic substrate including the steps of providing a terminal portion on the ceramic substrate, the ceramic substrate having a dielectric constant less than or equal to 7.0 units and a coefficient of thermal expansion of $5 \times 10^{-6}/°$ C. or less, forming at least one of a buffer layer and a barrier layer overlying the terminal portion of the ceramic substrate, wherein the buffer layer consists essentially of Cu and the barrier layer consists essentially of a material selected from the group consisting of Ni, Pd, and Pt, and brazing a metal conductor to the terminal portion of the ceramic substrate through the at least one of the buffer layer and the barrier layer with an Ag-based brazing filler material.

3 Claims, 1 Drawing Sheet

METHOD OF CONNECTING METAL CONDUCTOR TO CERAMIC SUBSTRATE

FIELD OF THE INVENTION

The present invention relates to metal/ceramic connections and, more particularly, to a method of connecting a metal conductor to a ceramic substrate.

BACKGROUND OF THE INVENTION

The substrate of an ultra-high speed IC package housing a semiconductor element, such as GaAs, Ge, Si, or the like, must have high mechanical strength, provide adequate electrical insulation, and provide an effective gas seal. Heretofore, to meet the aforementioned requirements, ceramic materials such as alumina and beryllia have been used to form such substrates. To join these substrates to metal conductors, terminal portions have been provided on the surface of the substrates and the metal conductors have been brazed to the terminal portions with an Ag or Ag-Cu eutectic brazing filler material at temperatures above 800° C.

IC packages having ceramic substrates with high dielectric constants such as alumina and beryllia, however, suffer from the disadvantage that when the IC package is used in a high frequency band on the order of several giga hertz (GHz), the signal propagation speed is limited and, thus, the IC package cannot be used in such higher frequency bands. To overcome this limitation, it has been proposed in Japanese patent application (OPI) No. 92943/1984 to form the ceramic substrate of the IC package from a $SiO_2$—$Al_2O_3$—MgO—ZnO-based sintered crystallized glass. It has been found, however, that because such crystallized glass substrates are lower in mechanical strength and heat resistance than alumina and beryllia, the use of Ag-based brazing filler materials causes cracks at the junction of the terminal portion of the substrate and the metal conductor due to the difference in thermal expansion during brazing.

To overcome the aforementioned cracking problem, it has been proposed in Japanese Utility Model Application No. 30456/1985 to braze metal conductors to the terminal portions of such substrates in IC packages using an Au-Sn or Au-Si eutectic brazing filler material at temperatures below 400° C. Such brazing filler materials allow metal conductors to be readily brazed to the terminal portions of the ceramic substrate and the thus formed IC package displays excellent characteristics in higher frequency bands. The use of such brazing filler materials, however, suffers from the disadvantage that the sealing temperature for housing the semiconductor elements is in the range of from 400° C. to 500° C. and the thus formed junctions are low in heat resistance.

Accordingly, it is an object of the invention to provide a method of connecting a metal conductor to a ceramic substrate which overcomes the difficulties and disadvantages of the prior art.

Additional objects will be set forth in part in the description which follows, and in part, will be obvious from the description, or may be learned by practice of the invention.

SUMMARY OF THE INVENTION

To achieve the foregoing objects and in accordance with the purpose of the invention, as embodied and broadly described herein, the method of connecting a metal conductor to a ceramic substrate of the present invention includes the steps of providing a terminal portion on the ceramic substrate, the ceramic substate having a dielectric constant less than or equal to 7.0 and a coefficient of thermal expansion of $5 \times 10^{-6}/°C$. or less, forming at least one of a buffer layer and a barrier layer overlying the terminal portion of the ceramic substrate, wherein the buffer layer consists essentially of Cu and the barrier layer consists essentially of a material selected from the group consisting of Ni, Pd, and Pt, and brazing a metal conductor to the terminal portion of the ceramic substrate through the at least one of the buffer layer and the barrier layer with an Ag-based brazing filler material.

The accompanying drawings, which are incorporated in and constitute a part of this specification, illustrate several exemplary embodiments of the invention and together with the description, serve to explain the principles of the invention.

DESCRIPTION OF THE PREFERRED EMBODIMENTS

Reference will not be made in detail to the present preferred embodiments of the invention, examples of which are illustrated in the accompanying drawings.

Figure 1:
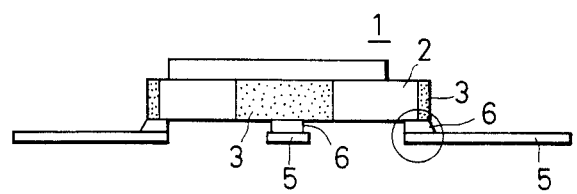
FIG. 1 is a side view of an example of an IC package in which metal conductors are connected to terminal portions of a ceramic substrate according to the present invention.

In accordance with the method of connecting a metal conductor to a ceramic substrate of the present invention, there is provided a terminal portion on a ceramic substrate, the ceramic substrate having a dielectric constant less than or equal to 7.0 and a coefficient of thermal expansion of $5 \times 10^{-6}/°C$. or less. In FIG. 1 an example of an IC package in which metal conductors are connected to terminal portions of a ceramic substrate is shown. As shown in FIG. 1, IC package 1 is comprised of ceramic substrate 2, terminal portions 3, metal conductors 5, and brazing filler material 6.

As embodied herein, substrate 2 is comprised of, in terms of weight percent, 58% $SiO_2$, 23% $Al_2O_3$, 13% MgO, 4% ZnO, 1% $B_2O_3$, and 1% $P_2O_3$. Substrate 2 has a dielectric constant of 5.5 and a thermal expansion coefficient of $27 \times 10^{-7}/°C$. ($r_t$—400° C.) and is obtained by mixing crystallized glass and resin, forming the mixture into a green sheet, and then sintering the green sheet at a temperature of from 900° C. to 1000° C. Examples of other suitable materials for substrate 2 having a low dielectric constant and a relatively small coefficient of thermal expansion include a composite material of alumina and a borosilicate glass, as well as a composite material of alumina and borosilicate lead glass.

As embodied herein, terminal portions 3 are formed by metallizing the surface of substrate 2. By way of example, terminal portions 3 may be formed by depositing metals of Group IVA (Ti, Zr, and Hf), Group VA (V, Nb, and Ta), Group VIA (Cr, Mo, and W), Group VIIA (Mn), Group VIIIA (Ni, Pd, and Pt), and their compounds, such as TaN, CrNi, TaAl, TaAlN, TaSi, and CrSiO on substrate 2 by a thin film forming method. Alternatively, terminal portions 3 may be formed by printing a thick film of a paste containing at least one material from the group consisting of Au, Cu, Ag, Ni, Pd, and Pt on substrate 2. Where the substrate 2 is sintered at relatively low temperatures, terminal portions 3 may be formed by simultaneously sintering a low resistance metal such as Au, Cu, or Ag on substrate 2.

Terminal portions 3 are preferably formed by depositing metallization layers of Ti having a thickness of 1000 Å, Mo having a thickness of 3000 Å, and Cu having a thickness of 5000 Å on substrate 2 by vacuum deposition or sputtering. Terminal portions 3 may also be formed by depositing Ti having a thickness of 1000 Å, W having a thickness of 1000 Å, and Pt having a thickness of 2000 Å, or by depositing Ti having a thickness of 1000 Å and Pd having a thickness of 6000 Å by vacuum deposition or sputtering.

As embodied herein, metal conductors 5 are lead wires comprised of a Ni-Fe alloy (4-2 alloy). By way of example, metal conductors 5 may also be formed of Kovar, W, Mo, or a Cu-W alloy.

Figure 2:
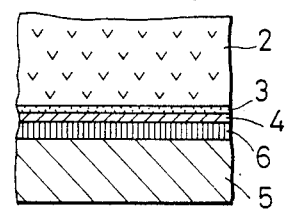
FIG. 2 is an enlarged sectional view of the junction encircled in FIG. 1 for carrying out the method according to a first preferred embodiment of the invention.

In accordance with the invention, at least one of a buffer layer and a barrier layer is formed overlying the terminal portion of the ceramic substrate. FIG. 2 depicts the method according to a first preferred embodiment of the invention. As shown in FIG. 2, buffer layer 4 consisting essentially of Cu is formed on terminal portion 3. As embodied herein, buffer layer 4 is formed by plating the surface of terminal portion 3 with Cu to a thickness of about $10\mu$.

Figure 3:
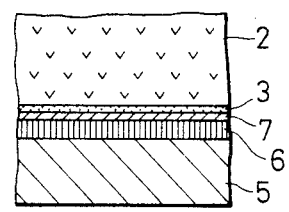
FIG. 3 is an enlarged sectional view of the junction encircled in FIG. 1 for carrying out the method according to a second preferred embodiment of the invention.

FIG. 3 depicts the method according to a second preferred embodiment of the invention. As shown in FIG. 3, barrier layer 7 is formed on terminal portion 3. Buffer layer 7 consists essentially of a material selected from the group consisting of Ni, Pd, and Pt. As embodied herein, barrier layer 7 is formed by plating the metallized surfaces of terminal portion 3 with Ni, Pd, or Pt to a thickness of about $10\mu$.

Figure 4:
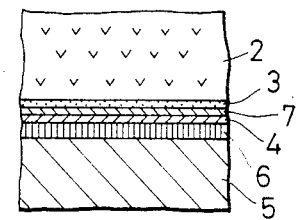
FIG. 4 is an enlarged sectional view of the junction encircled in FIG. 1 for carrying out the method according to a third preferred embodiment of the invention.

FIG. 4 depicts the method according to a third preferred embodiment of the invention. As shown in FIG. 4, barrier layer 7 is formed on terminal portion 3 and then buffer layer 4 is formed on barrier layer 7. In this embodiment, both barrier layer 7 and buffer layer 4 may be formed in the manner described above.

In accordance with the invention, a metal conductor is brazed to the terminal portion of the ceramic substrate through the at least one of the buffer layer and the barrier layer with an Ag-based brazing filler material. For carrying out the method according to the first preferred embodiment shown in FIG. 2, metal conductor 5 is brazed to terminal portion 3 through buffer layer 4 with brazing filler material 6. As embodied in FIG. 2, brazing filler material 6 is an Ag (72%)-Cu brazing alloy and the temperature of brazing is about 850° C.

For carrying out the method according to the second preferred embodiment shown in FIG. 3, metal conductor 5 is brazed to terminal portion 3 through barrier layer 7 with brazing filler material 6. As embodied in FIG. 3, brazing filler material 6 is pure Ag and the temperature of brazing is about 1000° C. Each of the materials which the barrier layer 7 may be formed of, namely Ni, Pd, and Pt, is inert in the presence of pure Ag.

For carrying out the method according to the third preferred embodiment shown in FIG. 4, metal conductor 5 is brazed to terminal portion 3 through barrier layer 7 and buffer layer 4 with brazing filler material 6. As embodied in FIG. 4, brazing filler material 6 is an Ag (72%)-Cu brazing alloy and the temperature of brazing is about 850° C.

It has been found that the formation of buffer layer 4 consisting essentially of Cu on the surface of terminal portion 3 improves both the heat resistance and the reliability of the brazed junction. In addition, because the buffer layer is formed of Cu, which has excellent ductility characteristics, it, in combination with the Ag-based brazing filler material also having excellent ductility, absorbs the stress/strain that results from the difference in thermal expansion between the members being joined. As a result, the formation of cracks in substrate 2 is avoided.

Barrier layer 7 serves to prevent any significant diffusion of the Ag-based brazing filler material 6, and the infiltration attributed to such diffusion, into terminal portion 3 during brazing. If such diffusion occurs, then terminal portion 3 may peel off from substrate 2 and cause cracks to be formed.

A 45° tension test was performed on the junction formed according to the first preferred embodiment of the invention (including a buffer layer consisting essentially of Cu) and the tensile strength of the junction was about 1.5 kg/mm$^2$. The same test was performed on a first comparative example in which the thickness of the Cu layer was less than $10\mu$ and on a second comparative example in which no Cu layer was formed. In both comparative examples, the tensile strength was lower (less than 0.2 kg/mm$^2$), and cracks were observed where the terminal portions peeled off.

Through the above tests, it has been found that the thickness of the Cu layer is an important factor, and this thickness should be at least $10\mu$, although the method of invention is operable with a Cu layer having a thickness of about $5\mu$. If the thickness of the Cu layer is too small, however, then the Ag-based brazing filler material reacts with the Cu during brazing and diffuses in the metallization layers of the terminal portion of the substrate. Consequently, the Cu layer cannot serve as a buffer member to absorb the stress/strain that results from the difference in thermal expansion between the members being joined, and cracks may be formed.

A 45° tension test was also performed on the junction formed according to the second preferred embodiment of the invention (including a barrier layer) and the tensile strength of the junction was about 1.6 kg/mm$^2$. The same test was performed on a comparative example which was formed without the barrier layer. The tensile strength of the comparative example was lower (less than 0.2 kg/mm$^2$), and cracks and infiltration were observed where the terminal portions peeled off.

The method of connecting a metal conductor to a ceramic substrate of the present invention is particularly suited for connecting a metal lead wire to a terminal portion of a crystallized glass multi-layer circuit substrate, such as disclosed by the present applicants in Japanese Patent Application No. 37157/1985.

It will be apparent to those skilled in the art that various modifications can be made in the method of connecting a metal conductor to a ceramic substrate of the present invention without departing from the scope or spirit of the invention. Although the present invention has been disclosed in terms of preferred embodiments, the invention is not limited thereto, and its scope is to be defined by the appended claims and their equivalents.

What is claimed is:

1. A method of connecting a metal conductor to a ceramic substrate in an IC package used in high frequency bands on the order of several GHz, said method comprising the steps of:

providing a terminal portion on the ceramic substrate, the ceramic substrate having a dielectric constant of less than or equal to 7.0 and a coefficient of thermal expansion of $5 \times 10^{-6}$/°C. or less;

forming a barrier layer on the terminal portion of the ceramic substrate, the barrier layer consisting essentially of a material selected from the group consisting of Ni, Pd, and Pt; and brazing a metal conductor to the terminal portion of the ceramic substrate through the barrier layer with a brazing filler material consisting essentially of pure Ag.

2. The method of claim 1, wherein said barrier layer is about 10 μm thick.

3. The method of claim 2, wherein said brazing step takes place at a brazing temperature of approximately 1000° C.